(12) United States Patent
Beale

(10) Patent No.: US 8,553,653 B2
(45) Date of Patent: *Oct. 8, 2013

(54) ARRANGEMENT AND METHOD FOR CHANNEL MAPPING IN A WIRELESS COMMUNICATION SYSTEM

(75) Inventor: Martin Beale, Bristol (GB)

(73) Assignee: Sony Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/289,621

(22) Filed: Nov. 4, 2011

(65) Prior Publication Data

US 2012/0051271 A1 Mar. 1, 2012

Related U.S. Application Data

(63) Continuation of application No. 12/768,518, filed on Apr. 27, 2010, now Pat. No. 8,107,444, which is a continuation of application No. 10/409,281, filed on Apr. 8, 2003, now Pat. No. 7,710,926.

(30) Foreign Application Priority Data

Apr. 8, 2002 (GB) .................................. 0208039.8

(51) Int. Cl.
*H04B 7/216* (2006.01)
*H04B 1/66* (2006.01)
*H04L 23/02* (2006.01)
*H03M 13/00* (2006.01)

(52) U.S. Cl.
USPC ........... 370/335; 370/334; 370/204; 370/464; 370/476; 455/102; 455/103; 375/264; 375/298; 714/757; 714/780

(58) Field of Classification Search
USPC .......... 370/335, 334, 204, 464, 476; 455/102, 455/103; 375/264, 298; 714/757, 780
See application file for complete search history.

(56) References Cited

U.S. PATENT DOCUMENTS

RE36,430 E 12/1999 Halbert-Lassalle et al.
6,148,209 A 11/2000 Hamalainen et al.
(Continued)

FOREIGN PATENT DOCUMENTS

CN 1310898 A 8/2001
DE 4219677 A1 2/1993
(Continued)

OTHER PUBLICATIONS

International Search Report mailed Aug. 1, 2003, for PCT Application No. PCT/GB2003/01577 filed Apr. 8, 2003, 3 pages.

(Continued)

*Primary Examiner* — Duc M Nguyen
(74) *Attorney, Agent, or Firm* — Oblon, Spivak, McClelland, Maier & Neustadt, L.L.P.

(57) ABSTRACT

An arrangement and method for channel mapping in a UTRA TDD HSDPA wireless communication system by applying interleaving functions in first (530) and second (540) interleaving means to a bit sequence to produce symbols for mapping to physical channels, the first and second interleaving means being arranged to map symbols from respectively systematic and parity bits in a predetermined scheme, e.g., mapping symbols in a forward direction when a channel has an even index number, and in a reverse direction when a channel has an odd index number. The symbols may comprise bit-pairs, each of a systematic bit and parity bit.

Systematic bits are preferably mapped to high reliability bit positions in TDD HSDPA, achieving a performance gain of between 0.2 dB and 0.5 dB. The forwards/reverse mapping allows a degree of interleaving that improves system performance in fading channels or channels disturbed by short time period noise or interference.

19 Claims, 7 Drawing Sheets

(56) References Cited

U.S. PATENT DOCUMENTS

| | | | |
|---|---|---|---|
| 6,151,296 | A | 11/2000 | Vijayan et al. |
| 6,304,581 | B1 | 10/2001 | Chen et al. |
| 6,356,528 | B1 | 3/2002 | Lundby et al. |
| 6,658,067 | B1 | 12/2003 | Piirainen et al. |
| 6,662,024 | B2 | 12/2003 | Walton et al. |
| 6,904,077 | B2 | 6/2005 | Toskala et al. |
| 7,027,782 | B2 | 4/2006 | Moon et al. |
| 7,710,926 | B2 * | 5/2010 | Beale ............... 370/335 |
| 8,107,444 | B2 * | 1/2012 | Beale ............... 370/335 |
| 2002/0003846 | A1 | 1/2002 | Khayrallah et al. |
| 2002/0061069 | A1 | 5/2002 | Tran et al. |
| 2003/0014709 | A1 | 1/2003 | Miyoshi et al. |
| 2003/0060173 | A1 | 3/2003 | Lee et al. |

FOREIGN PATENT DOCUMENTS

| | | |
|---|---|---|
| JP | 2001-197035 A | 7/2001 |
| WO | WO 98/43373 A1 | 10/1998 |
| WO | WO 9945660 | 9/1999 |
| WO | WO 00/72493 A1 | 11/2000 |
| WO | WO 01/24382 A1 | 4/2001 |
| WO | WO 01/33737 A1 | 5/2001 |
| WO | WO 0141314 A1 | 6/2001 |
| WO | WO 0241646 | 5/2002 |

OTHER PUBLICATIONS

Great Britain Search Report mailed Nov. 15, 2002, for GB Application No. 0208039.8 filed Apr. 8, 2002.

Chinese Office Action mailed Feb. 9, 2007, for China Application No. 03811286.8 filed Apr. 8, 2003, 17 pages.

Japanese Office Action mailed Jul. 8, 2008, for Japanese Application No. 2003-585342, 4 pages (English Translation attached, 5 pages).

Samsung. (Jan. 8-11, 2002), "Text Proposal for SMP (Symbol Mapping Based on Bit Priority)," 3GPP TSG-RAN WG1#23, Tdoc R1-02-0024, Espoo, Finland, 6 pages.

Siemens. (Nov. 19-23, 2001). "Interleaver Operation in Conjunction with SMP," 3GPP TSG-RAN WG#1, Tdoc R1-01-1231, Jeju, Korea, 4 pages.

Office Action mailed Mar. 9, 2010, in Korean Patent Application No. 10-2010-7012732 (with English translation).

Office Action mailed Oct. 11, 2005, in European Patent Application No. 03 717 442.2.

* cited by examiner

ARRANGEMENT AND METHOD FOR CHANNEL MAPPING IN A WIRELESS COMMUNICATION SYSTEM

CROSS-REFERENCE TO RELATED APPLICATIONS

The present application is a continuation application of and claims the benefit of priority under 35 U.S.C. §120 from U.S. application Ser. No. 12/768,518, filed Apr. 27, 2010, the entire contents of which is incorporated herein by reference. U.S. application Ser. No. 12/768,518 is a continuation application of U.S. application Ser. No. 10/409,281, filed Apr. 8, 2003, now U.S. Pat. No. 7,710,926, which is based upon and claims the benefit of priority under 35 U.S.C. §119 from prior British Patent Application No. 0208039.8, filed Apr. 8, 2002.

FIELD OF THE INVENTION

This invention relates to wireless communication systems and particularly to Packet-eased TDD-CDMA (Time Division Duplex-Code Division Multiple Access) systems such as UMTS (Universal Mobile Telecommunication System) systems complying with the evolving 3GPP (3rd Generation Partnership Project) standard.

BACKGROUND OF THE INVENTION

In the field of this invention it is known that for TDD HSDPA (High Speed Downlink Packet Access) a HS-DSCH (High Speed-Downlink Shared CHannel) transport channel can use QPSK (Quadrature Phase Shift Key) or 16 QAM (16-level Quadrature Amplitude Modulation) modulation. In the case of 16 QAM modulation, 4 bits are mapped to a 16 level signal (composed of 4 in-phase levels and 4 quadrature levels). Two of the mapped bits have a higher reliability than the other two mapped bits (the bits to be modulated can thus be classified as being "high reliability bits" or "low reliability bits").

HS-DSCH channel coding is known to use turbo codes. It is well known that performance of a turbo code can be improved if the systematic bits produced by the turbo coder are received with a greater reliability than the parity bits. It is thus natural to attempt to map the systematic bits from the output of the turbo coder to the "high reliability bits" within the 16 QAM constellation and the parity bits to the "low reliability bits" within the 16 QAM constellation. This scheme is known as "bit priority mapping".

Bit priority mapping is known to be implemented for FDD (Frequency Division Duplex) HSDPA using a "HARQ (Hybrid Automatic-Repeat-Request) bit collection interleaver" followed by an "HS-DSCH interleaver". The "HARQ bit collection interleaver" arranges the bits at the output of the physical layer hybrid ARQ (Automatic-Repeat-Request) functionality to achieve a preferential order of systematic bits at its output: the "HARQ bit collection interleaver" attempts to ensure that odd indexed bits are preferably systematic bits and even indexed bits are preferably parity bits.

The HS-DSCH interleaving stage interleaves the odd indexed and even indexed bits separately (in this way, the set of bits that are preferably systematic are kept separate from the set of bits that are preferably parity bits). In FDD HSDPA, the bits from the preferably systematic interleaver are mapped (in the physical channel mapping stage) to high reliability bits and the bits from the preferably parity interleaver are mapped to low reliability bits in the 16 QAM symbol.

In TDD, the physical channel mapping stage generally includes a function whereby odd indexed physical channels are filled with bits in a forward direction and even indexed physical channels are filled in the reverse direction. By filling odd indexed channels in the forward direction and even indexed channels in the reverse direction, an extra degree of interleaving is achieved. In general, the forwards/reverse mapping can be considered as a physical channel mapper interleaving function.

The TOD physical channel mapping scheme described above is suboptimal for HSDPA since it destroys the link between systematic bits and high reliability positions.

An alternative approach for physical channel mapping in TDD is to perform the identical operation to FDD: physical channels are all mapped in the forward direction consecutively (physical channel 1 is mapped in the forward direction; once this mapping is complete, left over bits are then mapped to physical channel 2 in the forward direction, etc.). This alternative approach will retain the benefit of mapping preferably systematic bits to high reliability bits and preferably parity bits to low reliability positions. However, this alternative approach does not give the interleaving benefit that is obtained from filling odd indexed physical channels in the forward direction and even indexed physical channels in the reverse direction.

A need therefore exists for channel mapping wherein the abovementioned disadvantage(s) may be alleviated.

STATEMENT OF INVENTION

In accordance with a first aspect of the present invention there is provided an arrangement for channel mapping in a wireless communication system, the arrangement comprising:
  first and second interleaving means for applying interleaving functions to a bit sequence to produce symbols for mapping to respectively first and second channels,
  the first and second interleaving means being arranged to map symbols in a predetermined scheme.

In accordance with a second aspect of the present invention there is provided an arrangement for channel demapping in a wireless communication system, the arrangement comprising:
  first and second deinterleaving means for applying deinterleaving functions to respectively first and second channels to produce a bit sequence representative of symbols mapped to respectively the first and second channels,
  the first and second deinterleaving means being arranged to deinterleave symbols mapped in a predetermined scheme.

In accordance with a third aspect of the present invention there is provided a method for channel mapping in a wireless communication system, the method comprising:
  applying interleaving functions in first and second interleaving means to a bit sequence to produce symbols for mapping to respectively first and second channels,
  the first and second interleaving means being arranged to map symbols in a predetermined scheme.

In accordance with a fourth aspect of the present invention there is provided a method for channel demapping in a wireless communication system, the method comprising:
  applying deinterleaving functions in first and second deinterleaving means to respectively first and second channels to produce bit sequences representative of symbols mapped to respectively the first and second channels, the first and second deinterleaving means deinterleaving symbols mapped in a predetermined scheme.

Briefly stated, in a preferred form the invention provides a new and inventive physical channel mapping/demapping scheme for TDD HSDPA which allows systematic bits to be mapped to high reliability positions in a 16 QAM (or higher order) modulation while retaining an interleaving benefit by application of a forwards mapping rule for odd indexed physical channels and a backwards mapping rule for even indexed physical channels. The forwards/reverse mapping may be generally considered a physical channel mapper based interleaving function.

The new scheme allows symbols, as opposed to bits, to be mapped into physical channels. Symbols may be assigned consecutively to odd indexed physical channels and even indexed physical channels. Physical channels may be mapped alternately in a forwards and a reverse direction.

It is not strictly necessary to apply the mapping scheme at the symbol level. It is possible to perform the mapping such that systematic-parity bit pairs (a pair consisting of one systematic bit and one parity bit) are assigned consecutively to odd indexed physical channels and even indexed physical channels. Physical channels may be mapped alternately in a forwards and a reverse direction.

The new mapping scheme may be applied at a transmitter and an inverse process applied at the receiver.

In this text, unless the context otherwise requires, the term symbol is intended to cover any representation of a plurality of bits.

BRIEF DESCRIPTION OF THE DRAWINGS

Three symbol mapping schemes incorporating the present invention will now be described, by way of example only, with reference to the accompanying drawings, in which.

DESCRIPTION OF PREFERRED EMBODIMENTS

Figure 1:
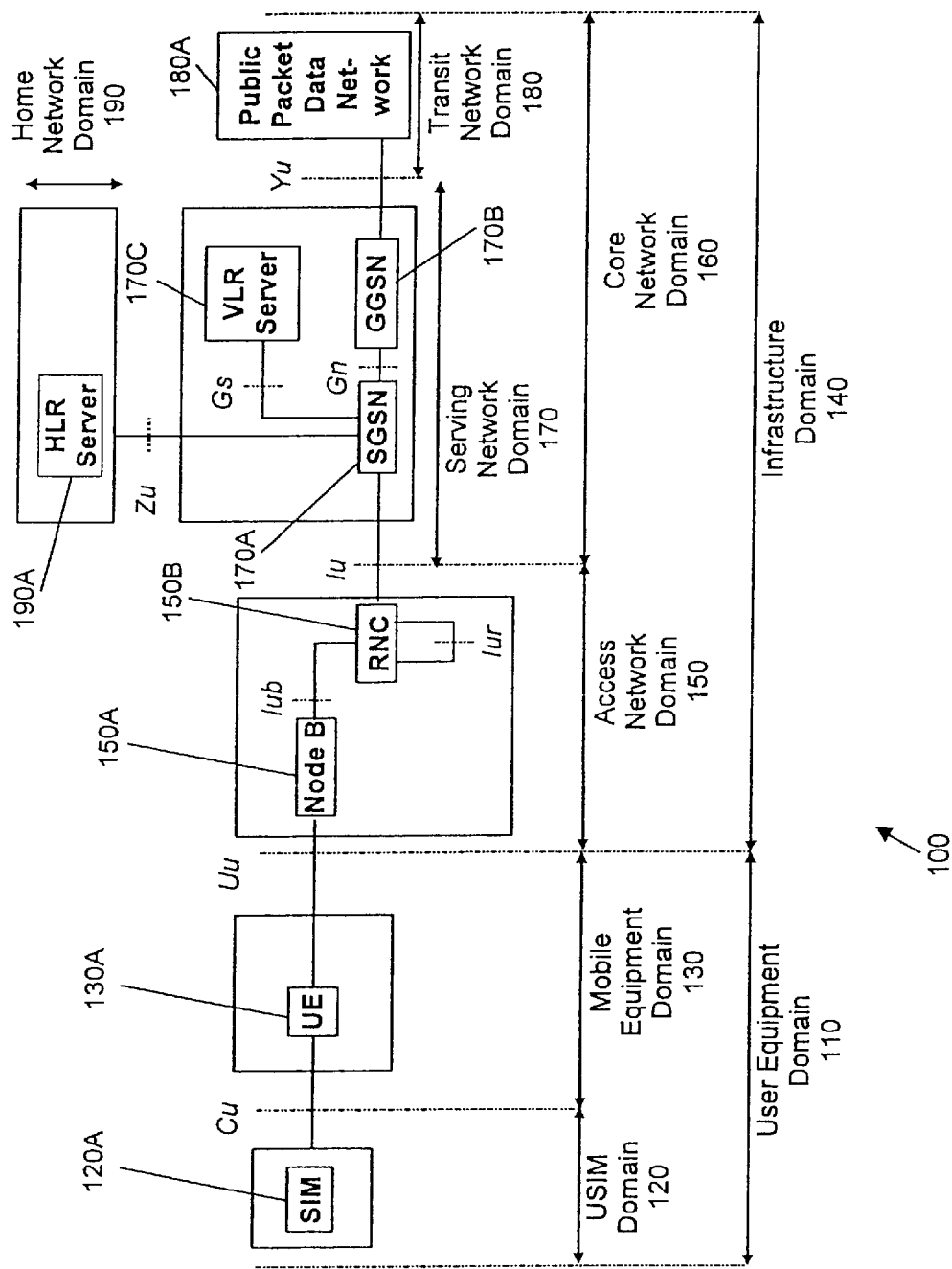
FIG. 1 illustrates a block diagrammatic representation of a UTRA system in which the present invention is used.

Referring firstly to FIG. 1, a typical, standard UMTS network (100) is conveniently considered as comprising: a user equipment domain (110), made up of a user SIM (USIM) domain (120) and a mobile equipment domain (130); and an infrastructure domain (140), made up of an access network domain (150), and a core network domain (160), which is in turn made up of a serving network domain (170) and a transit network domain (180) and a home network domain (190).

In the mobile equipment domain (130), user equipment UE (130A) receives data from a user SIM (120A) in the USIM domain 120 via the wired Cu interface. The UE (130A) communicates data with a Node B (150A) in the network access domain (150) via the wireless Uu interface.

Within the network access domain(150), the Node B (150A) communicates with a radio network controller or RNC (150B) via the Iub interface. The RNC (150B) communicates with other RNC's (not shown) via the Iur interface. The RNC (150B) communicates with a SGSN (170A) in the serving network domain (170) via the Iu interface. Within the serving network domain (170), the SGSN (170A) communicates with a GGSN (170B) via the Gn interface, and the SGSN (170A) communicates with a VLR server (170C) via the Gs interface. The SGSN (170A) communicates with an HLR server (190A) in the home network domain (190) via the Zu interface. The GGSN (170B) communicates with public data network (180A) in the transit network domain (180) via the Yu interface.

Thus, the elements RNC (150B), SGSN (170A) and GGSN (170B) are conventionally provided as discrete and separate units (on their own respective software/hardware platforms) divided across the access network domain (150) and the serving network domain (170), as shown the FIG. 1.

The RNC (150B) is the UTRAN element responsible for the control and allocation of resources for numerous Node B's (150A); typically 50 to 100 Node B's may be controlled by one RNC. The RNC also provides reliable delivery of user traffic over the air interfaces. RNC's communicate with each other (via the interface Iur) to support handover and macrodiversity.

The SGSN (170A) is the UMTS Core Network element responsible for Session Control and interface to the Location Registers (HLR and VLR). The SGSN is a large centralised controller for many RNCs.

The GGSN (170B) is the UMTS Core Network element responsible for concentrating and tunnelling user data within the core packet network to the ultimate destination (e.g., internet service provider—ISP).

Figure 2:
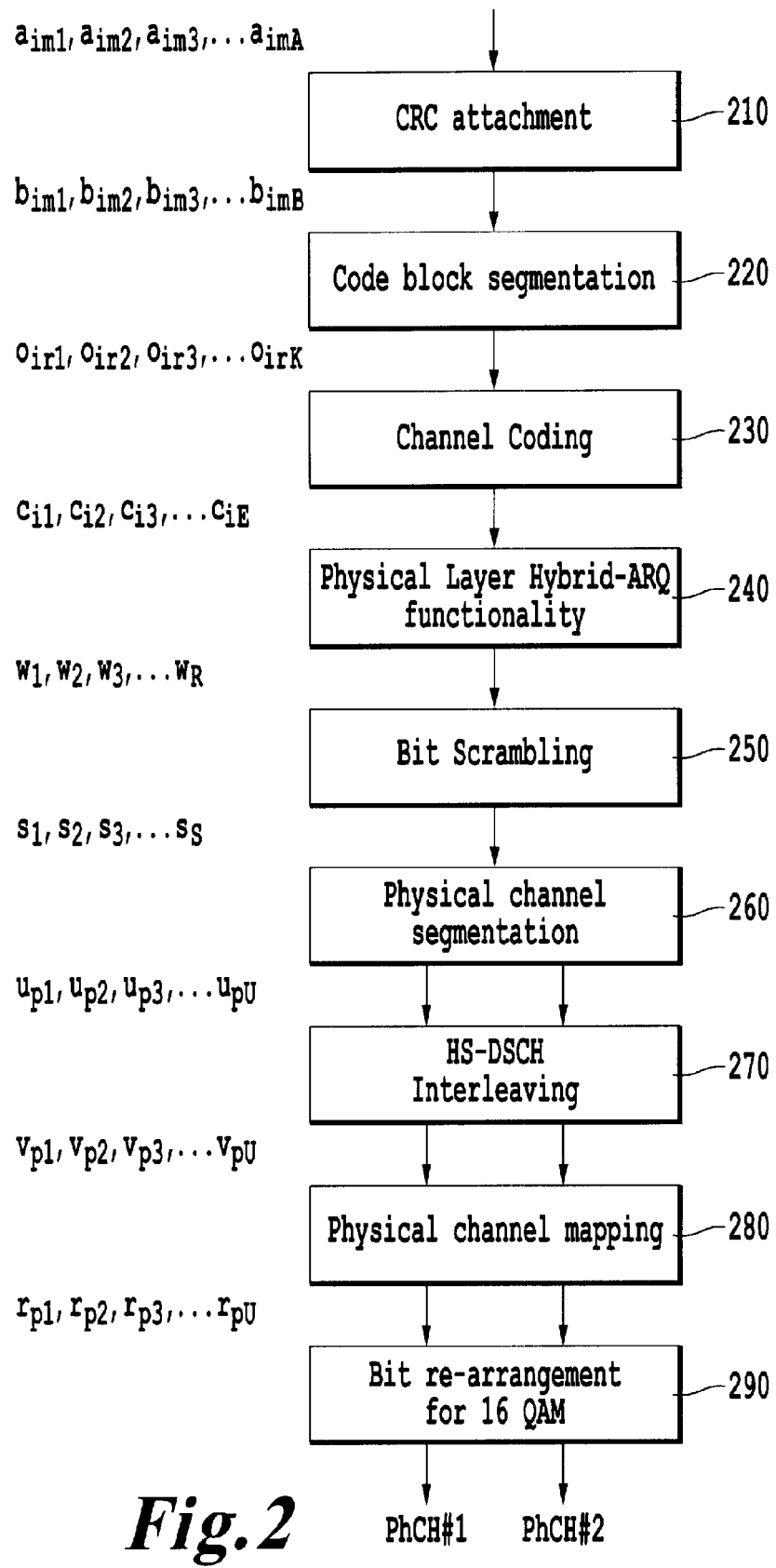
FIG. 2 illustrates a transport channel processing chain for TDD HSDPA in the system of FIG. 1.

The wireless Uu interface utilises a transport channel TrCH to transport information between UE's (130A) and Node B's (150A). The transport channel processing chain for TDD HSDPA is shown in FIG. 2. As shown, CRC (Cyclic Redundancy Check) attachment (210) is followed by code block segmentation (220), Channel Coding (230), Physical Layer Hybrid ARQ function (240), Bit Scrambling (250), Physical Channel Segmentation (260), HS-DSCH Interleaving (270), Physical Channel Mapping (280) and finally Bit Re-arrangement for 16 QAM (290) to produce codes for two physical channels PhCH#1 and PhCH#2. It will be understood that such a transport channel processing chain is in general well known and need not be described in further detail.

The HS-DSCH transport channel can use QPSK or 16 QAM modulation. In the case of 16 QAM modulation as shown, 4 bits are mapped to a 16 level signal (composed of 4 in-phase levels and 4 quadrature levels). Two of the mapped bits have a higher reliability than the other two mapped bits (the bits to be modulated can thus be classified as being "high reliability bits" or "low reliability bits").

The HS-DSCH channel coding uses turbo codes, as well understood. It is well known that performance of a turbo code can be improved if the systematic bits produced by the turbo coder are received with a greater reliability than the parity bits. It is thus natural to attempt to map the systematic bits from the output of the turbo coder to the "high reliability bits" within the 16 QAM constellation and the parity bits to the "low reliability bits" within the 16 QAM constellation. This scheme is known as "bit priority mapping".

Bit priority mapping is implemented for FDD HSDPA using a "HARQ bit collection interleaver" followed by an "HS-DSCH interleaver". The "HARQ bit collection interleaver" arranges the bits at the output of the physical layer hybrid ARQ function (240) of FIG. 2 to achieve a preferential order of systematic bits at its output; the "HARQ bit collection interleaver" attempts to ensure that odd indexed bits are preferably systematic bits and even indexed bits are preferably parity bits.

The HS-DSCH interleaving stage (270) of FIG. 2 interleaves the odd indexed and even indexed bits separately (in this way, the set of bits that are preferably systematic are kept separate from the set of bits that are preferably parity bits). In FDD HSDPA, the bits from the (preferably systematic) interleaver are mapped (in the physical channel mapping stage) to high reliability bits and the bits from the (preferably parity) interleaver are mapped to low reliability bits in the 16 QAM symbol.

Figure 3:
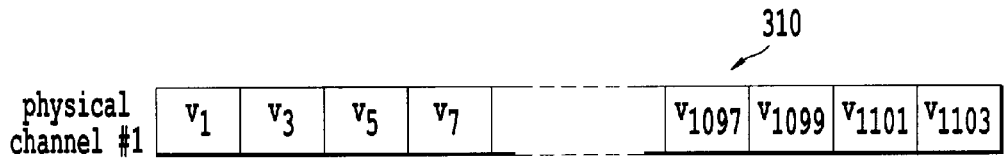
FIG. 3 illustrates a prior art TDD physical channel mapping of 1104 bits to 2 channels modulated with 16 QAM.

In TDD, the physical channel mapping stage (280) generally includes a function whereby odd indexed physical channels are filled with bits in a forward direction and even indexed physical channels are filled in the reverse direction. This process is illustrated in FIG. 3 for the case where the bitstream $v_1, v_2, v_3 \ldots v_{1103}, v_{1104}$ is mapped to two physical channels supporting 16 QAM. By filling odd indexed channels in the forward direction and even indexed channels in the reverse direction, an extra degree of interleaving is achieved. In general, the forwards/reverse mapping can be considered as a physical channel mapper interleaving function.

However, the TDD physical channel mapping scheme described above is suboptimal for HSDPA since it destroys the link between systematic bits and high reliability positions. Considering the case illustrated in FIG. 3, the "HARQ bit collection interleaver" preferably assigns systematic bits to odd indexed positions ($v_{2k-1}$, shown generally at 310) and parity bits to even indexed positions ($v_{2k}$, shown generally at 320): in this case, the preferably systematic bits are mapped to the first physical channel and the preferably parity bits are mapped to the second physical channel; this will lead to a suboptimal performance.

Figure 4:
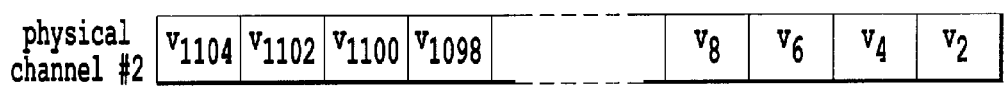
FIG. 4 illustrates an alternative prior art physical channel mapping scheme to that shown in FIG. 3.

As illustrated in FIG. 4, an alternative known approach for physical channel mapping in TDD is to perform the identical operation as for FDD, in which physical channels are all mapped in the forward direction consecutively: physical channel 1 is mapped in the forward direction (at indexed positions $v_1 \ldots v_{552}$, shown generally at 410), and once this mapping is complete, left over bits are then mapped to physical channel 2 (at indexed positions $v_{553} \ldots v_{1104}$, shown generally at 420) in the forward direction, etc. In the alternative shown in FIG. 4, it is assumed that odd indexed bits in the physical channel are mapped to high reliability bit positions in the modulated symbol by the modulator. This alternative approach will retain the benefit of mapping preferably systematic bits to high reliability bits and preferably parity bits to low reliability positions. However, this alternative approach does not give the interleaving benefit that is obtained from filling odd indexed physical channels in the forward direction and even indexed physical channels in the reverse direction as described above in relation to FIG. 3.

In order to alleviate the disadvantages of the alternative physical channel mapping schemes for TDD HSDPA described above in relation to FIG. 3 and FIG. 4, the present invention provides a new and inventive physical channel mapping scheme for TDD HSDPA. As will be described in greater detail below, this new scheme allows systematic bits to be mapped to high reliability positions in a 16 QAM (or higher order) modulation while retaining an interleaving benefit by application of a forwards mapping rule for odd indexed physical channels and a backwards mapping rule for even indexed physical channels. The forwards/reverse mapping may be generally considered a physical channel mapper based interleaving function.

The new scheme allows symbols, as opposed to bits, to be mapped into physical channels. Symbols may be assigned consecutively to odd indexed physical channels and even indexed physical channels. Physical channels may be mapped alternately in a forwards and a reverse direction. The forwards/reverse mapping may be generally considered a physical channel mapper based interleaving function.

It is not strictly necessary to apply the mapping scheme at the symbol level. It is possible to perform the mapping such that systematic-parity bit pairs (a pair consisting of one systematic bit and one parity bit) are assigned consecutively to odd indexed physical channels and even indexed physical channels. Physical channels may be mapped alternately in a forwards and a reverse direction. The forwards/reverse mapping may be generally considered a physical channel mapper based interleaving function.

The new mapping scheme may be applied at a transmitter (e.g., UE or Node B) and an inverse process applied at a receiver (e.g., Node B or UE).

Embodiment 1

Figure 5:
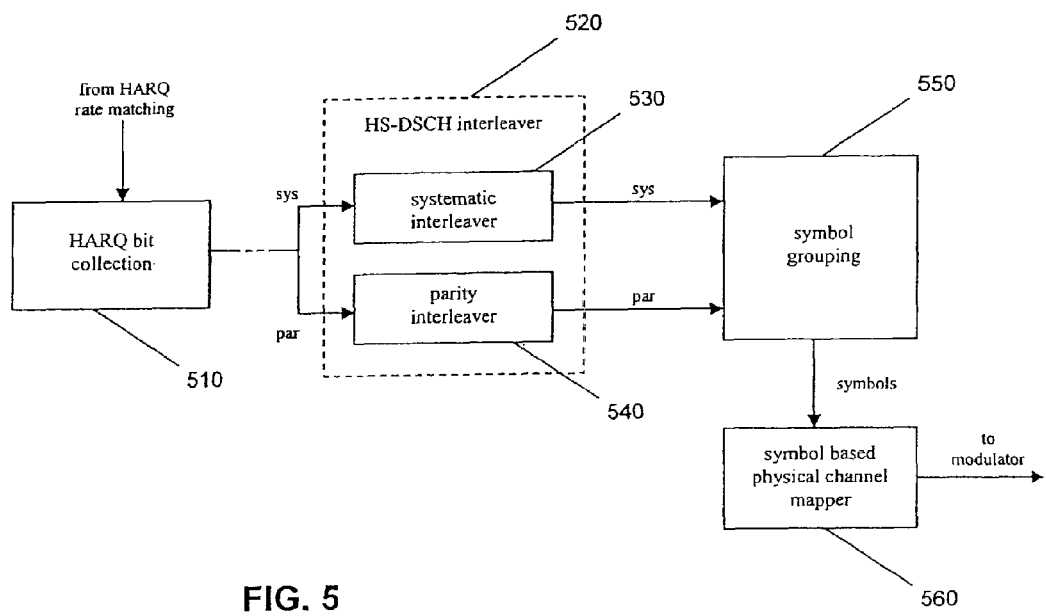
FIG. 5 illustrates portions of the transport channel processing chain relevant to a first embodiment of the present invention.

The relevant sections of the TDD HSDPA transport channel processing chain in order to achieve embodiment 1 are illustrated in FIG. 5.

As will be described in greater detail below, a HARQ bit collection block (510) collects bits from earlier HARQ rate matching function (not shown) and supplies bits to a HS-DSCH interleaver (520), which comprises a systematic interleaver (530) and a parity interleaver (540). It will be understood by those skilled in the art that the bits labelled "sys" are preferably systematic bits and the bits labelled "par" are preferably parity bits. In general, the HARQ rate matching function will not produce equal numbers of systematic and parity bits, for this reason the "sys" stream contains preferably systematic bits, but if there are insufficient systematic bits, this stream may also contain parity bits. It will further be understood that the blocks 510-540 are well-known per se and need not be described in further detail.

As shown in FIG. 5, the TDD HSPDA transport channel processing chain includes a symbol grouping block (550) and a symbol based physical channel mapping block (560). It will be understood that these two blocks can, in a practical implementation, if desired, be merged into a single block.

In embodiment 1 of the invention, the symbol grouping function (550) takes a group of bits from the "sys" stream and a group of bits from the "par" stream (in the case of 16 QAM modulation, there will be 2 bits from the "sys" stream and 2 bits from the "par" stream). The symbol grouping function (550) maps the two groups of bits to a symbol such that the high reliability bits of the symbol created are taken from the "sys" group and the low reliability bits of the symbol created are taken from the "par" group.

In embodiment 1 of the invention, the grouped symbols, marked "symbols" at the output of the symbol grouping function (550) in FIG. 5, are sent to the symbol based physical channel mapper (560). The symbol based physical channel mapper (560) maps symbols to physical channels such that:

symbols are mapped to physical channels in increasing order, odd indexed physical channels are mapped with symbols in the forwards direction, and even indexed physical channels are mapped in the reverse direction.

Figure 6:
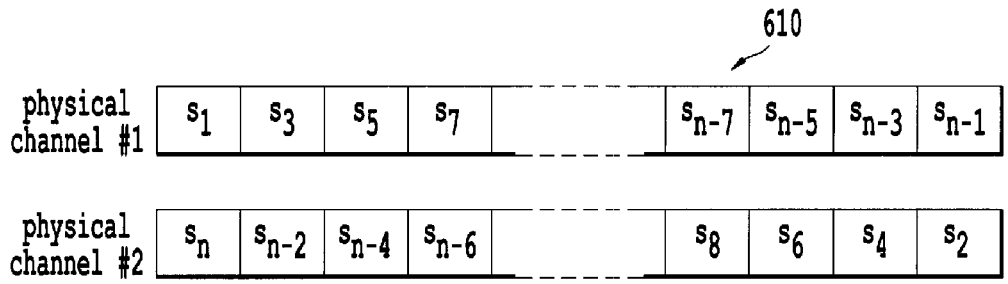
FIG. 6 illustrates symbol based physical channel mapping according to the embodiment illustrated in FIG. 5.

The symbols produced by the symbol grouping function (560) are supplied to a modulator (not shown) for modulation for transmission on the transport channel in known manner, such that reliability based ordering applied in the physical channel mapper is maintained by the modulator. If the symbols produced by the symbol grouping function (560) are denoted $s_1, s_2, s_3, s_4 \ldots s_{n-1}, s_n$ and these symbols are mapped to two physical channels (for the sake of illustration), then these symbols are mapped to physical channels #1 (610) and #2 (620) as shown in FIG. 6.

Those skilled in the art will readily understand that the inverse process to that described above is applied at the receiver, UE (130A) or Node B (150A), for this embodiment, in such a manner that bit reliability in the modulator is maintained in the physical channel demapper.

Embodiment 2

Figure 7:
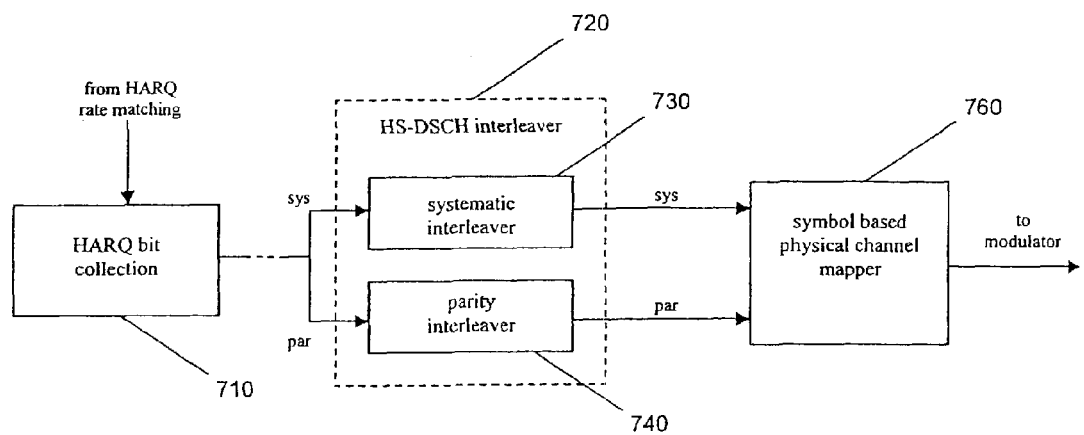
FIG. 7 illustrates portions of the transport channel processing chain relevant to a second embodiment of the present invention.

Referring now to FIG. 7, in a second embodiment of the invention (similarly to embodiment 1 described above in relation to FIG. 5), a HARQ bit collection block (710) collects bits from earlier HARQ rate matching function (not shown) and supplies bits to a HS-DSCH interleaver (720), which comprises a systematic interleaver (730) and a parity interleaver (740).

As shown in FIG. 7, the TDD HSPDA transport channel processing chain in embodiment 2 includes a symbol based physical channel mapping block (760) that supplies symbols to a modulator (not shown) for modulation for transmission on the transport channel in known manner, but in comparison with the FIG. 5 it can be seen that there is no symbol grouping function such as the symbol grouping block (550); instead embodiment 2 the order in which bits are mapped to physical channels is redefined in relation to the physical channel mapping for FDD HSDPA. For the sake of clarity, the following explanation of embodiment 2 focuses on the physical channel mapping operation for the case of 16 QAM modulation. Those skilled in the art will be able to generalise this explanation to modulations other than 16 QAM.

In embodiment 2, as in embodiment 1 described above, the bits labelled "sys" are preferably systematic bits and the bits labelled "par" are preferably parity bits.

In embodiment 2 of the invention, there is no explicit "symbol grouping" function. The "symbol based physical channel mapper" (760) in embodiment 2 of the invention maps bits to physical channels with full knowledge of the order that the bits will be read out of the mapped physical channels by the modulator (not shown). In this embodiment of the invention, groups of bits are mapped to physical channels on a group-by-group basis. In this embodiment of the invention, the group size is the number of bits that are carried by a modulated symbol (in the case of 16 QAM, the group size is 4 bits).

As an example, if the modulator breaks up a physical channel containing bits $u_1, u_2, u_3, u_4, \ldots u_{549}, u_{550}, u_{551}, u_{552}$ into symbols according to the rule that $u_1, u_2, u_5, u_6$ etc. (in general $u_{4k+1}, u_{4k+2}$ for the case of 16 QAM) are mapped to high reliability bits in the modulated symbol (note the difference in definition used compared to that used for FIG. 3) and other bits are mapped to low reliability positions within the modulated symbol, then the "symbol based physical channel mapper" (760) of embodiment 2 maps an input bit sequence $v_1, v_2, v_3 \ldots v_{1103}, v_{1104}$ (where bits $v_{2k-1}$ are taken from the "sys" stream of FIG. 7 and bits $v_{2k}$ are taken from the "par" stream of FIG. 7) into mapped physical channel bits #1 (810) and #2 (820) as shown in FIG. 8.

Figure 8:
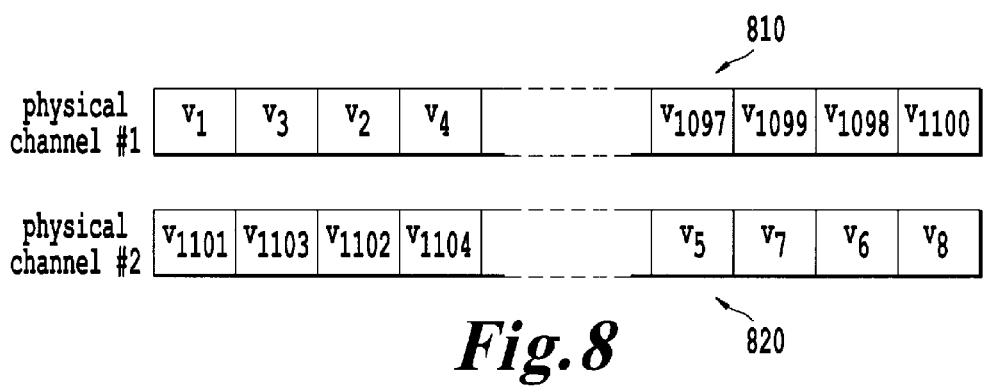
FIG. 8 illustrates symbol based physical channel mapping according to the embodiment illustrated in FIG. 7.

The mapping illustrated in FIG. 8 achieves the effect that the modulator will map bits from the "sys" stream to high reliability bit positions in the modulated symbol and bits from the "par" stream to low reliability positions in the modulated symbol. The mapping of FIG. 8 also achieves the interleaving effect of a "forwards/reverse" mapping of bits.

Embodiment 3

Figure 9:
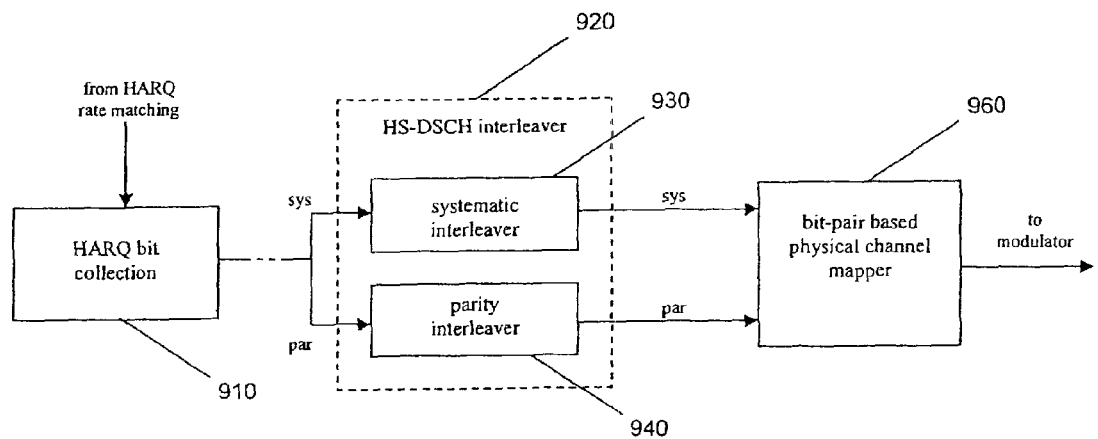
FIG. 9 illustrates Portions of transport channel processing chain relevant to a third embodiment of the present invention.

Referring now to FIG. 9, (similarly to embodiment 2 described above in relation to FIG. 7) a HARQ bit collection block (910) collects bits from earlier HARQ rate matching function (not shown) and supplies bits to a HS-DSCH interleaver (920), which comprises a systematic interleaver (930) and a parity interleaver (940).

Similarly to embodiment 2, the TDD HSPDA transport channel processing chain in embodiment 3 includes a bit-pair based physical channel mapping block (960) that supplies bit-pairs to a modulator (not shown) for modulation for transmission on the transport channel in known manner, and unlike embodient 1 described above in relation to FIG. 5 there is no symbol grouping function such as the symbol grouping block (550). In embodiment 3, as in embodiment 2, the order in which bits are mapped to physical channels is redefined in relation to the physical channel mapping for FDD HSDPA. For the sake of clarity, as above, the following explanation of embodiment 3 focuses on the physical channel mapping operation for the case of 16 QAM modulation. Those skilled in the art will be able to generalise this explanation to modulations other than 16 QAM.

In embodiment 3, as in embodiments 1 and 2 described above, the bits labelled "sys" are preferably systematic bits and the bits labelled "par" are preferably parity bits.

In the third embodiment of the invention, the group size is 2 bits (the group consists of a single systematic bit and a single parity bit). The group of bits in embodiment 3 consists of a single (preferably) systematic bit and a single (preferably) parity bit. In embodiment 3, bits are assigned to physical channels in systematic-parity bits pairs (a pair consisting of a single systematic bit and a single parity bit). In this section, for the sake of clarity, the explanation focuses on the physical channel mapping operation for the case of 16 QAM modulation. Those skilled in the art will be able to generalise this explanation to modulations other than 16 QAM.

In embodiment 3 of the invention, bit pairs are mapped to physical channels rather than symbol-sized groups of bits. The "bit-pair based physical channel mapper" (960) in embodiment 3 of the invention maps bits to physical channels with full knowledge of the order that the bits will be read out of the mapped physical channels by the modulator.

As an example, if the modulator breaks up a physical channel containing bits $u_1, u_2, u_3, u_4 \ldots u_{549}, u_{550}, u_{551}, u_{552}$ into symbols according to the rule that $u_1, u_2, u_5, u_6$, etc. (in general $u_{4k+1}, u_{4k+2}$ for the case of 16 QAM) are mapped to high reliability bits in the modulated symbol (note the difference in definition used compared to that used for FIG. 3) and other bits are mapped to low reliability positions within the modulated symbol, then the "bit-pair based physical channel mapper" of embodiment 3 maps an input bit sequence $v_1, v_2, v_3 \ldots v_{1103}, v_{1104}$ (where bits $v_{2k-1}$ are taken from the "sys" stream of FIG. 9 and bits $v_{2k}$ are taken from the "par" stream of FIG. 9) into mapped physical channel bits #1 (1010) and #2 (1020) as shown in FIG. 10.

Figure 10:
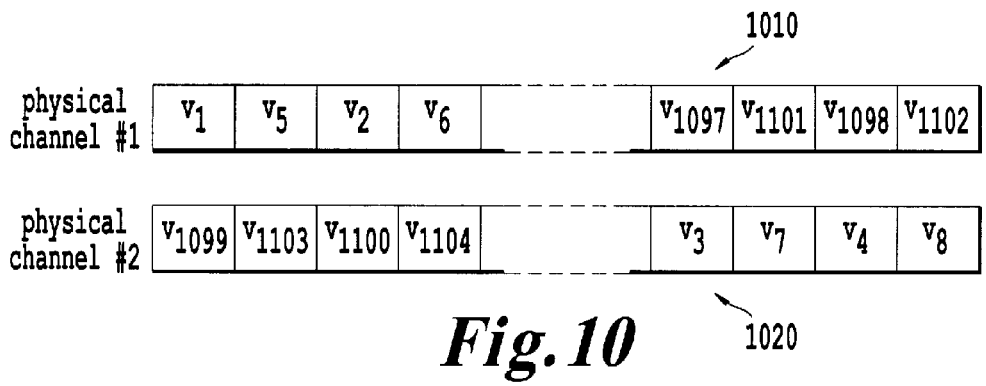
FIG. 10 illustrates symbol based physical channel mapping according to the embodiment illustrated in FIG. 9.

A salient point about the mapping illustrated in FIG. 10 is that bits from a bit-pair are mapped to the same physical channel (for instance, it may be noted that bits $v_1$ and $v_2$ which belong to the same bit-pair are both mapped to physical channel 1 whereas bits $v_3$ and $v_4$ which belong to the same bit-pair are both mapped to physical channel 2). This contrasts with embodiment 2 where $v_1$, $v_2$, $v_3$ and $v_4$ are all mapped to physical channel 1 because a 16 QAM symbol consists of exactly 4 bits.

The mapping illustrated in FIG. 10 achieves the effect that the modulator will map bits from the "sys" stream to high reliability bit positions in the modulated symbol and bits from the "par" stream to low reliability positions in the modulated symbol. The mapping of FIG. 10 also achieves the interleaving effect of a "forwards/reverse" mapping of bits.

It will be appreciated that the method described above for modulation symbol/bit-pair mapping in a wireless communication system may be carried out in software running on a processor (not shown), and that the software may be provided as a computer program element carried on any suitable data carrier (also not shown) such as a magnetic or optical computer disc.

It will be also be appreciated that the method described above for modulation symbol/bit-pair mapping in a wireless communication system may alternatively be carried out in hardware, for example in the form of an integrated circuit (not shown) such as an FPGA (Field Programmable Gate Array) or ASIC (Application Specific Integrated Circuit).

It will be understood that the modulation symbol/bit-pair mapping scheme described above provides the following advantages that:

Systematic bits are preferably mapped to high reliability bit positions in TDD HSDPA. This achieves a performance gain of between 0.2 dB and 0.5 dB.

A forwards/reverse mapping is possible for successive physical channels. This achieves a degree of interleaving that improves system performance in fading channels or channels disturbed by short time period noise or interference.

The invention claimed is:

1. A base station for operating in a wireless communication system, the base station comprising:
   first interleaving logic for interleaving a bit sequence comprising systematic bits to produce an interleaved systematic bit sequence;
   second interleaving logic for interleaving a bit sequence comprising parity bits to produce an interleaved parity bit sequence; and
   mapping logic for mapping bits in accordance with a modulation scheme such that:
      bits from the interleaved systematic bit sequence are mapped to high reliability bits of the modulation scheme and bits from the interleaved parity sequence are mapped to low reliability bits of the modulation scheme, and
      the systematic bits and the parity bits are mapped to physical channels in different ones of a forward direction and a reverse direction.

2. The base station of claim 1, wherein the modulation scheme includes bit-pairs each comprising a systematic bit and a parity bit.

3. The base station of claim 2, wherein the bit-pairs are arranged to be modulated by 16QAM modulation.

4. The base station of claim 2, wherein the wireless communication system is a Universal Terrestrial Radio Access Time Division Duplex (UTRA TDD) system.

5. The base station of claim 4, wherein the bit-pairs are mapped in an odd indexed physical channel in a forward direction and an even indexed physical channel in a reverse direction, and the odd and even indexed physical channels are comprised in a transport channel.

6. The base station of claim 1, configured to operate on a High Speed Downlink Shared Channel.

7. The base station of claim 6, configured to operate in High Speed Downlink Packet Access.

8. A mobile user equipment for operating in a wireless communication system, the mobile user equipment comprising:
   first interleaving logic for interleaving a bit sequence comprising systematic bits to produce an interleaved systematic bit sequence;
   second interleaving logic for interleaving a bit sequence comprising parity bits to produce an interleaved parity bit sequence; and
   mapping logic for mapping bits in accordance with a modulation scheme such that:
      bits from the interleaved systematic bit sequence are mapped to high reliability bits of the modulation scheme and bits from the interleaved parity sequence are mapped to low reliability bits of the modulation scheme, and
      the systematic bits and the parity bits are mapped to physical channels in different ones of a forward direction and a reverse direction.

9. The mobile user equipment of claim 8, wherein the modulation scheme includes bit-pairs each comprising a systematic bit and a parity bit.

10. The mobile user equipment of claim 8, wherein the bit-pairs are arranged to be modulated by 16QAM modulation.

11. The mobile user equipment of claim 8, wherein the wireless communication system is a Universal Terrestrial Radio Access Time Division Duplex (UTRA TDD) system.

12. The mobile user equipment of claim 11, wherein the bit-pairs are mapped in an odd indexed physical channel in a forward direction and an even indexed physical channel in a reverse direction, and the odd and even indexed physical channels are comprised in a transport channel.

13. A mobile user equipment for channel de-mapping in a wireless communication system, the mobile user equipment comprising:
   de-mapping logic for de-mapping bits in accordance with a modulation scheme;
   ungrouping logic arranged to ungroup groups of the bits to produce an interleaved parity bit sequence and an interleaved systematic bit sequence, the groups of the bits each comprising parity bits and systematic bits, wherein the systematic bits and the parity bits are mapped to physical channels in different ones of a forward direction and a reverse direction;
   first deinterleaving logic for deinterleaving the systematic bit sequence to produce a deinterleaved systematic bit sequence comprising systematic bits; and
   second deinterleaving logic for deinterleaving the parity bit sequence to produce a deinterleaved parity bit sequence comprising parity bits.

14. The mobile user equipment of claim 13, wherein the modulation scheme includes bit-pairs, each bit-pair comprising a systematic bit and a parity bit.

15. The mobile user equipment of claim 14, wherein the bit-pairs are modulated by 16QAM modulation.

16. The mobile user equipment of claim 13, wherein the wireless communication system is a Universal Terrestrial Radio Access Time Division Duplex (UTRA TDD) system.

17. The mobile user equipment of claim 16, wherein the bit-pairs are mapped in an odd indexed physical channel in a forward direction and an even indexed physical channel in a reverse direction, and the odd and even indexed physical channels are comprised in a transport channel, and the de-mapping logic de-maps the bit-pairs from the transport channel.

18. The mobile user equipment of claim 13, configured to operate on a High Speed Downlink Shared Channel.

19. The mobile user equipment of claim 18, configured to operate in High Speed Downlink Packet Access.

* * * * *